United States Patent
Levit et al.

(10) Patent No.: US 6,781,205 B1
(45) Date of Patent: Aug. 24, 2004

(54) ELECTROSTATIC CHARGE MEASUREMENT ON SEMICONDUCTOR WAFERS

(75) Inventors: Lawrence B. Levit, Alamo, CA (US); Alexander Ignatenko, Hayward, CA (US)

(73) Assignee: Ion Systems, Inc., Berkeley, CA (US)

( * ) Notice: Subject to any disclaimer, the term of this patent is extended or adjusted under 35 U.S.C. 154(b) by 73 days.

(21) Appl. No.: 10/269,426

(22) Filed: Oct. 11, 2002

(51) Int. Cl.[7] .......................... H01L 23/62; B65D 85/00
(52) U.S. Cl. ...................... 257/355; 206/711; 206/709; 206/710
(58) Field of Search ............................... 257/355–363; 206/701, 706, 709–712

(56) References Cited

U.S. PATENT DOCUMENTS

| | | | |
|---|---|---|---|
| 5,755,332 A | * | 5/1998 | Holliday et al. ............ 206/711 |
| 6,398,032 B2 | * | 6/2002 | Fosnight et al. ............ 206/711 |
| 6,421,113 B1 | * | 7/2002 | Armentrout ................... 355/75 |
| 6,513,654 B2 | * | 2/2003 | Smith et al. ................ 206/454 |
| 6,719,142 B1 | * | 4/2004 | Menear et al. .............. 206/711 |

OTHER PUBLICATIONS

SEMI FOUP–Load Port Interoperability Implementation Recommendations, Revision 1.02; vol. 1, Interoperability Implementation, International FOUP–Load Port Interoperability Study Group PI&C Committee SEMI FID; Sep. 3, 2001; 103 pages, with forward dated Dec. 7, 2001, 2 pages.
Front Opening Unified Pod (FOUP) Fire Protection: A General Overview; International Sematech, Technology Transfer #99083804A–TR, Nov. 5, 1999; 12 pages.
http://www.semiseeknews.com/press_release4274.htm; SemiSeekNews; "New Entegris 300 mm FOUP Improves Yield for Semiconductor Industry; Three Enhancements to F300 AutoPod FOUP to be Demonstrated at SEMICON Taiwan," accessed Nov. 21, 2002; pp. 1–5.
http://www.entegris.com/news/PR2002/pr91602A.html; 2002 press release, "New Entegris 300 MM FOUP Improves Yield for Semiconductor Industry," Accessed Nov. 21, 2002, pp. 1–2.

* cited by examiner

Primary Examiner—Ori Nadav
(74) Attorney, Agent, or Firm—Fenwick & West LLP

(57) ABSTRACT

An enclosure for transporting semiconductor wafers includes a pair of sensors that are responsive to electrostatic fields mounted on conductive grounded plates in facing orientations on opposite sides of a position within the enclosure at which a semiconductor wafer is to be located. Electronic circuitry within the enclosure in communication with the sensors supplies monitoring signals to remote circuitry external to the enclosure that isolates sources of contaminants and provides remote balance and gain adjustments. Calibration of the balance and gain adjustments uses a grounded plate for zero balance reference, and uses a plate of insulating material that is charged to a known potential for referencing gain adjustments to produce related outputs.

16 Claims, 6 Drawing Sheets

ELECTROSTATIC CHARGE MEASUREMENT ON SEMICONDUCTOR WAFERS

RELATED APPLICATIONS

The subject matter of this application is related to the subject matter disclosed in U.S. patent application Ser. No. 10/197,085, entitled "Apparatus And Method For Measuring Static Charge On Wafers, Disks, Substrates, Masks, And Flat Panel Displays", filed on Jul. 6, 2002 by John E. Menear, et al.

FIELD OF THE INVENTION

This invention relates to measurement of electrostatic fields associated with static charge on semiconductor wafers, and more particularly to apparatus for sensing such electrostatic fields on semiconductor wafers during transitions into and out of semiconductor processing stations.

BACKGROUND OF THE INVENTION

Contemporary semiconductor facilities are designed to process wafers of about 300 mm diameter. Static charge on wafers creates problems by attracting contamination particles, and can also cause electrostatic discharge (ESD) which damages the sub-micron size features of the semiconductor devices fabricated on the wafers. The wafer accumulates static charge from contact and separation (triboelectric charging) that occurs during normal process-chamber activity and from contact with moving equipment such as robotic loaders. Due to the material of the wafer (oxide-coated silicon), the static charges remain isolated and the charge distribution on both sides of the wafer is often not uniform, thus requiring several measurement points to characterize charge on the wafer. There is difficulty in measuring electrostatic fields associated with static charge on a wafer without interfering with the wafer processing.

At the beginning and end of each processing step in the semiconductor manufacturing process, the wafer is placed in a specialized carrier called a Front Opening Universal Pod (FOUP). Some possible methods for taking charge measurements on semiconductor wafers in this environment include:

1. Stopping the robot to measure the field at several points along the surface of the wafer with a fieldmeter or charge sensors while the wafer is being transported to or from a process chamber; or
2. Using charge sensors to measure several points on the surface of the wafer while at rest in the FOUP.

The first method of stopping the robot with the wafer in mid-transport to measure with a fieldmeter the electric field caused by charge, can provide charge measurement which varies with the relationship to ground. Hence, the electric fields generated by charges on the wafer will vary from tool to tool and even vary at a particular tool if the location at which the robot is stopped cannot be accurately controlled. For that reason, this method promotes making relative rather than absolute measurements for comparing one static charge control solution in a particular tool with another solution in the same tool. Additionally, the process must stop to make the measurement, and that may increase process time or adversely affect the process as unacceptable consequences. Locating electrostatic sensors within process equipment is difficult due to space requirements and measurement interactions with moving equipment. Measurements with a fieldmeter are often inaccurate due to the precision required in the measurement distance, the variations in the boundary conditions (i.e. location of grounded surfaces) due to moving robotics, and only one side of the wafer can be measured at one time.

A second method of measuring the charge while the wafer is stored in the FOUP does not interfere with the process, but measurements may not be accurate because the charge may have time to dissipate. Also, sensors inside the FOUP can measure only a small area and may not accurately characterize the charge distribution on a 300 mm wafer.

SUMMARY OF THE INVENTION

In accordance with one embodiment of the present invention charge measurements are made as the wafer is moved into and out of the FOUP for greater measurement accuracy. This method provides a well-defined ground plane to fix the boundary conditions and allow the measurements to be compared from tool-to-tool as the FOUP containing the wafers being processed is moved from tool to tool. Wafer processing is not stopped and static charge may not have time to dissipate. Further, by digitizing and recording the output of the fieldmeter sensors, many readings of charge on the surface of the wafer can be recorded and mapped over much of the surface of the wafer as the wafer enters the FOUP.

To obtain the most precise measurements possible, fieldmeter sensors or other charge-measuring sensors are installed near the front door of the FOUP to measure electric field associated with charge on wafers in motion as they enter the FOUP. Sensors are positioned on opposite sides of the wafer to make simultaneous electric field measurements on both sides of the wafer. The entire wafer passes between the sensors. Fieldmeter sensors and modified fieldmeter circuit boards provide improved response time of the fieldmeters that are attached to metal disks positioned above and below a wafer to measure the electric fields on both sides of a wafer in motion into or out of the FOUP. The grounded conductive disks fix the geometry and thus establish an accurate relationship between measurement values and the charge on the wafers.

To avoid interfering with the tool process, the sensors are stationed on metal disks above and below the wafer as it passes in and out of the FOUP. The sensors scan the wafer along a linear segment or stripe across an off-center segment of the wafer as it moves into and out of the FOUP to measure charge at numerous points on the passing wafer. Precise measurements along the surface of the wafer may be determined knowing the distance between the sensor and the wafer (typically, about one inch), combined with the solid angle of sensor sensitivity and, hence, the measured area of the sensor zone as the wafer moves into and out of the FOUP. In one example, the lengthwise measurement angle of a sensor is 44° @3 dB, and the cross-wise measurement angle of such sensor is 54° @3 dB, and are thus capable of scanning about one-third of the area on each side of a wafer. The two sensors are located off center to avoid scanning the end effector of a robotic handler. Conventional charge sensors are modified to enhance speed of response to facilitate taking about 20 measurements along a diametric segment (or a chord segment displaced from the diameter) of a wafer being moved by a robot into or out of a FOUP.

DETAILED DESCRIPTION OF THE INVENTION

Figure 1:
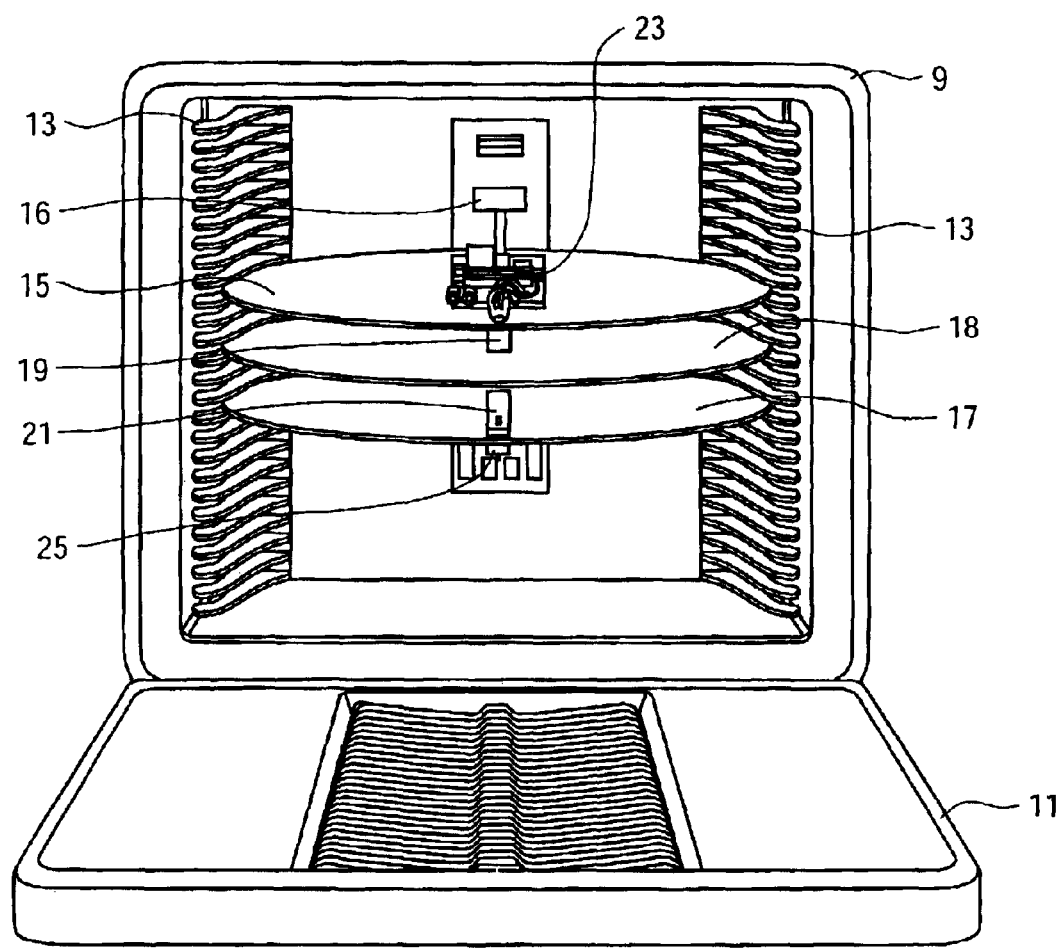
FIG. 1 is a pictorial illustration of a modified FOUP in accordance with one embodiment of the present invention.

Referring now to FIG. 1, there is shown a frontal view of a FOUP 9, with the front door 11 open, and with a plurality of slots 13 arranged in the sides of the FOUP 9 in aligned sets to receive and hold 300 mm semiconductor wafers therein. The FOUP forms an enclosure about a load of wafers, with the front door 11 closed, to reduce contaminant exposure of the wafers and to facilitate transport between processing stations and robotic handling at each processing station.

Figure 2:
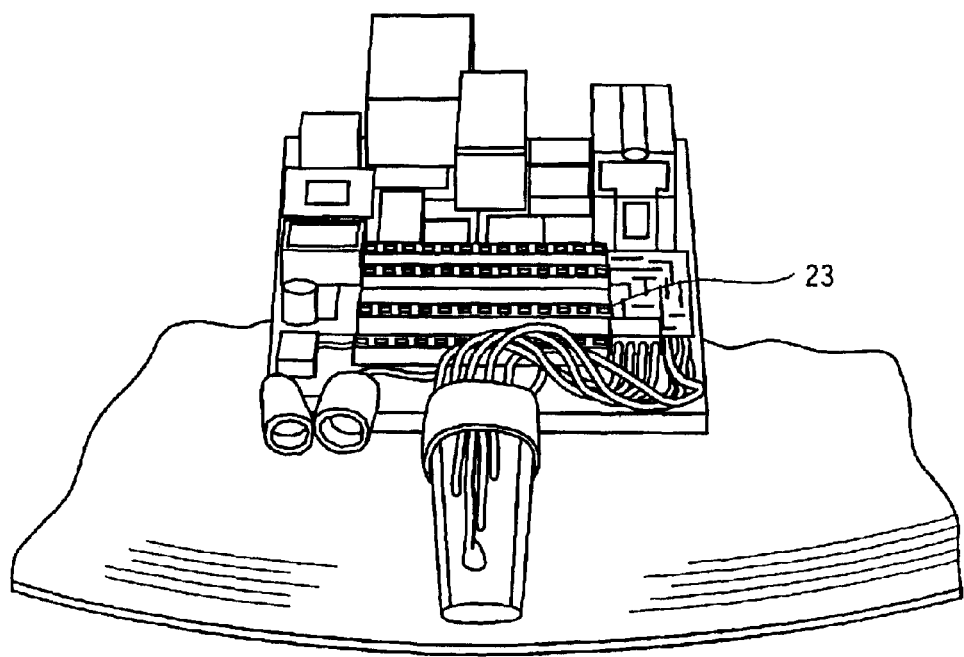
FIG. 2 is a pictorial illustration of field meter circuitry mounted in the modified FOUP of FIG. 1.
Figure 3:
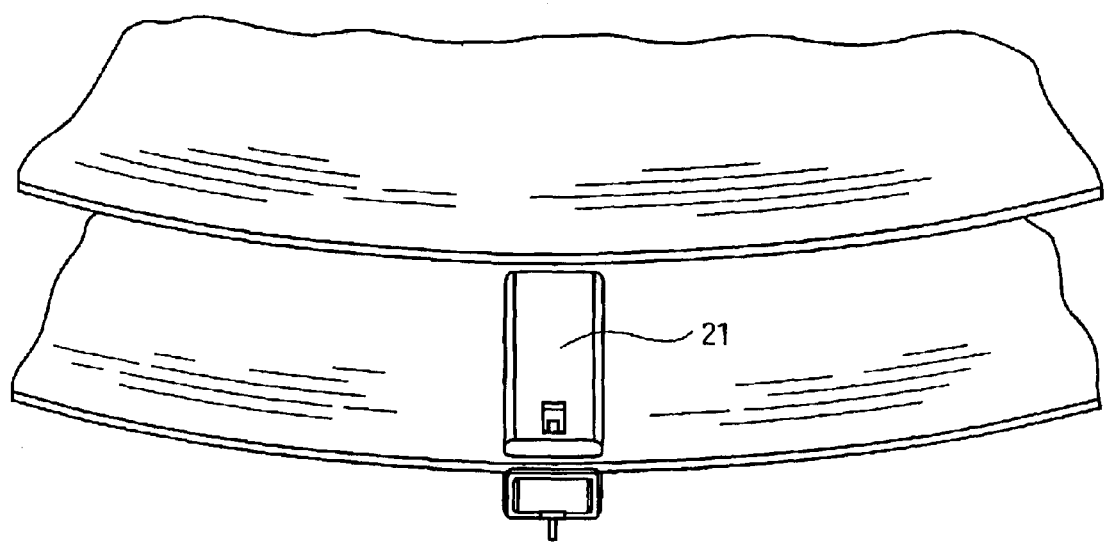
FIG. 3 is a pictorial illustration of sensor for the circuitry of FIG. 2.
Figure 4:
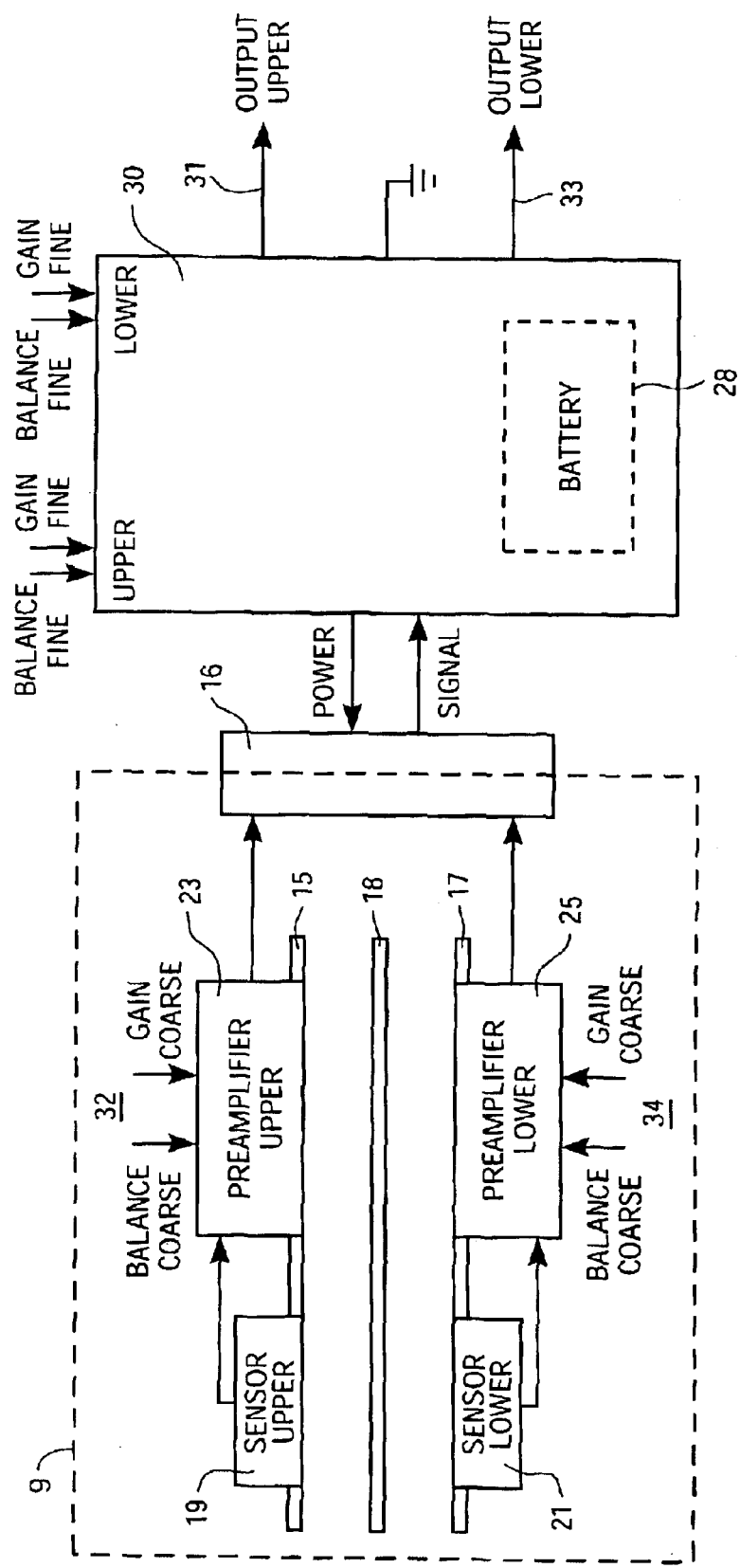
FIG. 4 is a schematic illustration of the structure of FIG. 1.
Figure 5:
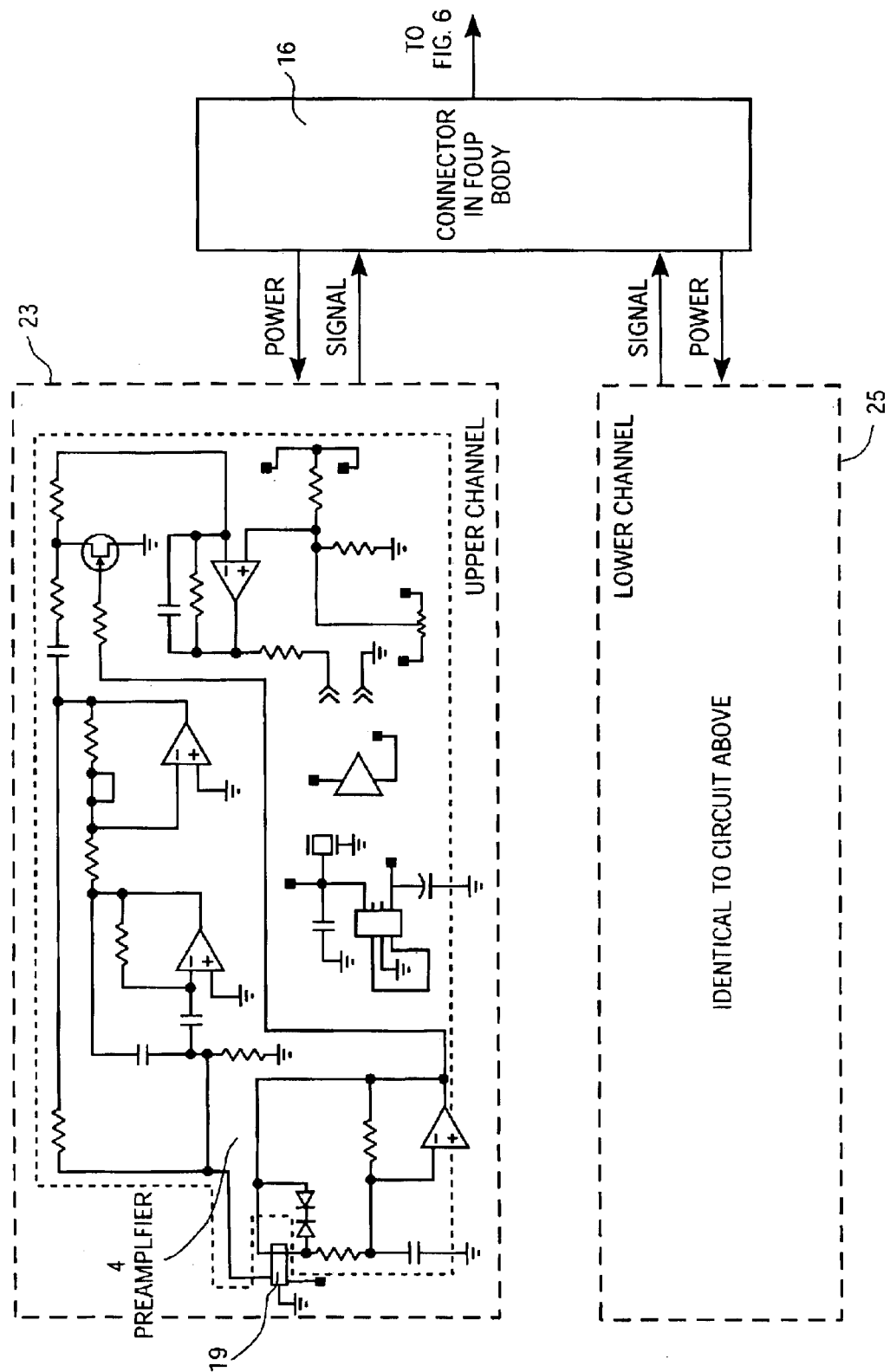
FIG. 5 is a schematic diagram of one embodiment of the field-sensing circuitry of FIG. 2.

In accordance with one embodiment of the present invention, upper and lower metal disks 15, 17 of approximately the size of a 300 mm semiconductor wafer 18 are disposed in sets of side slots above and below a set of slots 13 in which a semiconductor wafer is to be positioned. Each metal disk 15, 17 supports a sensor 19, 21 for a fieldmeter on a side of the metal disk 15, 17 that faces a surface of a semiconductor wafer 18 disposed between the metal disks 15, 17, as shown in FIGS. 3 and 4. The sensors 19, 21 are mounted near a forward edge of the associated metal disk 15, 17 in direct communication with local field meter circuitry 23, 25 mounted on circuit boards on opposite sides of the metal disks 15, 17 from the respective sensors 19, 21, as shown in FIGS. 2 and 5. In this configuration, the sensors 19, 21 are accurately spaced from a semiconductor wafer 18 disposed between metal disks 15, 17 and are closely referenced to isopotential surfaces (at ground potential) provided by the associated metal disks 15, 17 that are in electrical contact with the grounded side wall and slots. The sensors 19, 21 are displaced off center to sense electric field strength along a stripe across the adjacent surface of a wafer that is moved into or out of the FOUP. Multiple wafers may be moved by robotic handlers into and out of the pair of side slots disposed between the metal disks 15, 17 for the purpose of measuring charge thereon, and then moved to other slots within the FOUP above and below the metal disks 15, 17 for storage and transport, as otherwise usually accomplished by a FOUP. Conventional field sensors 19, 21 (commercially available, for example, as Model No. 775 from Ion Systems, Inc.) have a field-sensing view at the mounted spacing from the surface of a wafer that facilitates scanning approximately one-third of an adjacent surface area of a wafer 18 as the wafer is moved into or out of the FOUP. This portion of the surface area on each side of a wafer is characterized as providing adequate sampling of charged regions on the wafer, for example, via statistical extrapolation correlated with fully-tested sample wafers.

The field meter circuitry 23, 25 mounted on the surfaces of the disks 15, 17 that are remote from a semiconductor wafer are connected externally of the FOUP through connector 16 in the rear wall of the FOUP to remote circuitry, as shown in FIGS. 4 and 5. Trim pots and other components of the remote circuitry such as battery power supply 48 that promote contaminants or require manual access are associated with circuitry 30 disposed outside the FOUP and provide control and fine adjustments of gain and balance of the sensors 19, 21 and field meters 23, 25 in each channel. One-time, factory-set coarse gain and balance adjustments 32, 34 may remain associated with the interior circuits 23, 25 as thereafter not contributing any contaminants within the FOUP. The response times of the field meter circuits are increased by reducing the resistance and capacitance connected in conventional roll-off filters within the field meter circuits of the upper and lower channels 23, 25. Such circuits may be simplified versions of standard field meters.

Figure 6:
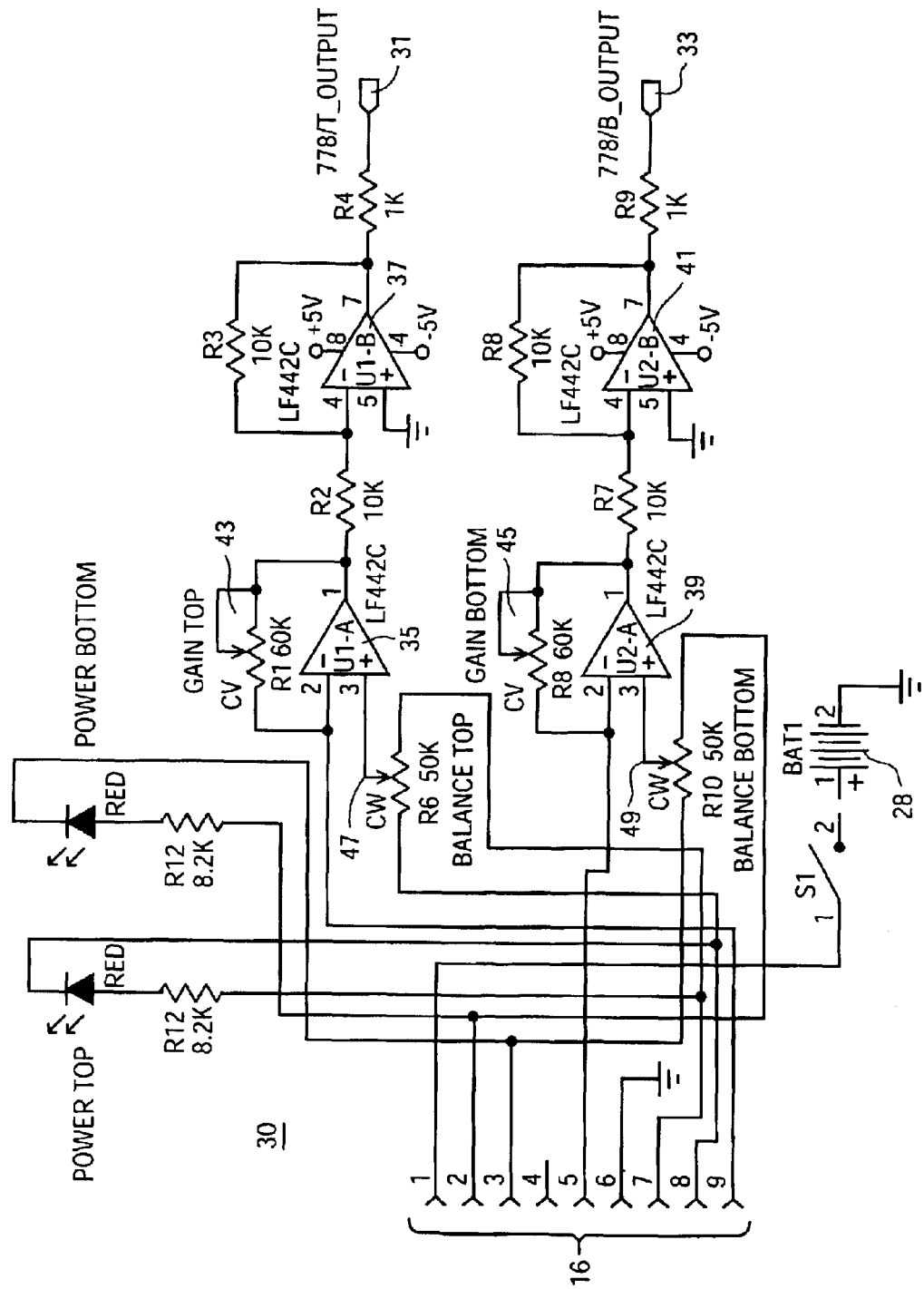
FIG. 6 is a schematic diagram of the remote circuitry for remote operation with the circuitry of FIG. 5.

Referring now to the schematic diagram of FIG. 6, there is shown remote circuitry 30 for operation with the sensors and fieldmeters 19, 21, 23, 25 of FIG. 5 that are arranged in upper and lower channels. The remote circuitry 30 is assembled on a circuit board or integrated circuit that is mounted outside the FOUP, with associated battery 28 and trim pots for fine gain and balance adjustments. The remote circuitry 30 receives the signals from the fieldmeters 23, 25 within the FOUP via connector 16 and modifies the resultant outputs 31, 33 according to gain and balance adjustments made on the circuitry during calibration, as later described herein. The outputs 31, 33 are thus representative pulses indicative of charges present on the portions of the surfaces of a semiconductor wafer 18 being scanned during movement into or out of the FOUP 9. Such outputs may be displayed, for example, on an oscilloscope or digitized and stored for analyses of peak amplitudes, distribution along the wafer surface, and the like. The remote circuitry 30 includes successive amplifier stages 35, 37 and 39, 41 for each of the upper and lower sensor channels. The input stage 35, 39 of each channel includes a gain adjustment 43, 45 connected in the feedback circuit and a balance adjustment 47, 49 connected to a reference input. In this way, the remote gain and balance adjustments 43, 45, 47, 49 facilitate modifying the fieldmeter signals picked up inside the FOUP 9 to reflect accurately the charge density or electric field sensed by the sensors 19, 21 in the particular configuration within the FOUP 9.

Figure 7:
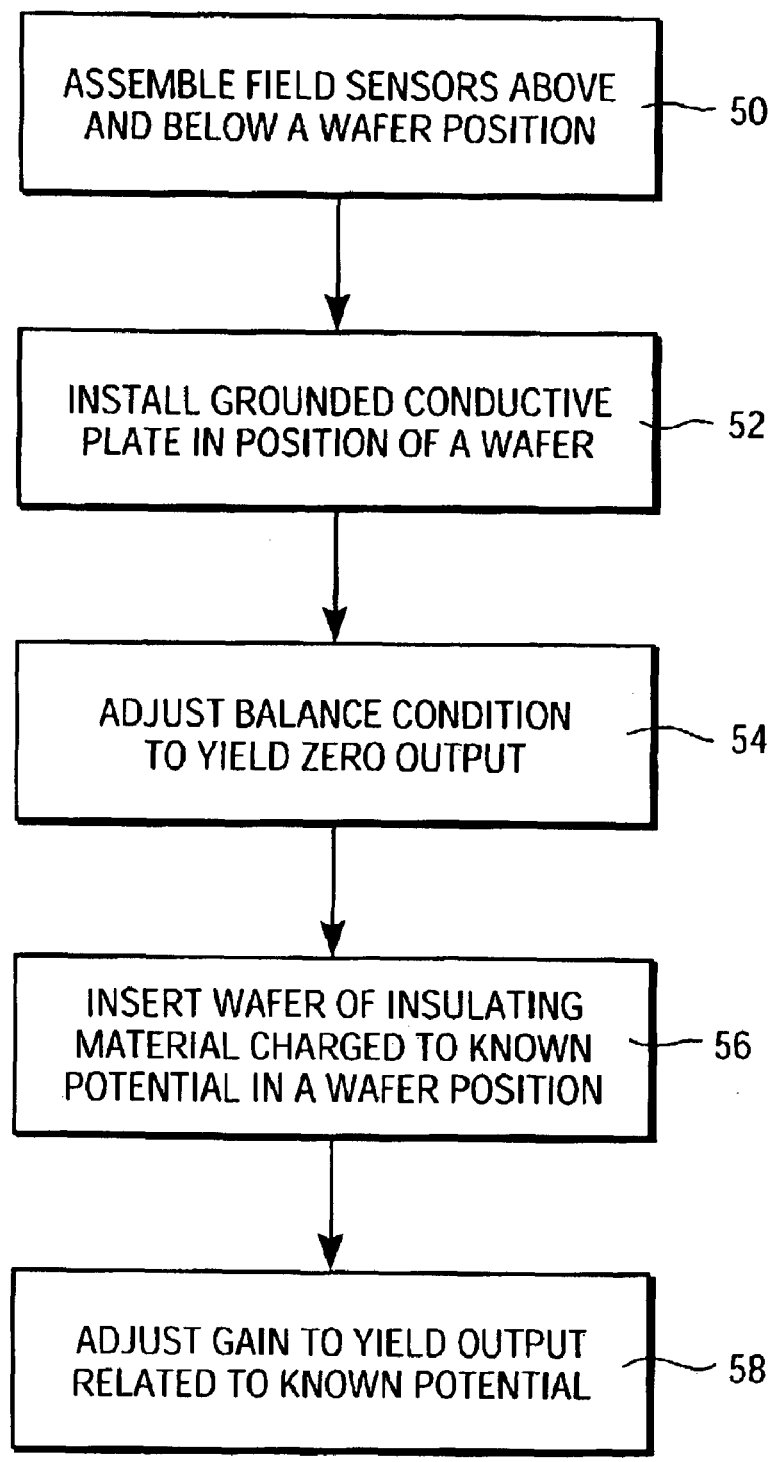
FIG. 7 is a flow chart indicating one embodiment of a calibration procedure according to the present invention.

Referring now to the flow chart of FIG. 7, there is shown a calibration sequence employed to set the gain and balance controls of the external circuitry 30, as follows. A grounded metal plate is inserted 52 in a position between the upper and lower disks 15, 17 and sensors 19, 21 at which a semiconductor wafer would be positioned 50, and the balance adjustments 47, 49 are adjusted 54 to yield zero outputs 31, 33. Next, for gain .adjustments, a plate of insulative material such as quartz, glass, Teflon, or the like, having dimensions similar to a wafer is charged to a known level (e.g. 1000 volts) and is positioned 56 between the upper and lower disks 15, 17 as a semiconductor wafer would be, while noting the levels of the outputs 31, 33. The gain trim pots 43, 45 are then adjusted 58 to correlate the outputs 31, 33 with the known level of charge on the insulative plate. These calibration procedures thus simulate charge that may accumulate on a semiconductor wafer, for example, coated with silicon dioxide ($S_iO_2$), an insulator, to provide highly accurate indications of electric fields attributable to surface charges present on semiconductor wafers moved into or out of the FOUP 9.

Therefore, the improved FOUP according to the present invention provides convenient structure for sensing charge on semiconductor wafers without significant interference with operations of automated robotic handling equipment. In addition, remote circuitry external to the foup facilitates gain and balance adjustments that might contribute contaminants and that might otherwise be extremely difficult to achieve on fieldmeter circuitry mounted inside the FOUP.

What is claimed is:

1. Apparatus for monitoring electrostatic fields on a semiconductor wafer, comprising:

an enclosure including side walls having a plurality of slots for supporting at least one semiconductor wafer therein;

at least one conductive layer supported within the enclosure in substantially plane-parallel, spaced orientation relative to a semiconductor wafer supported therein;

a sensor responsive to electrostatic field disposed on the conductive layer on a side thereof facing a position at which a semiconductor wafer is to be supported within the enclosure;

electronic circuitry communicating with the sensor and mounted within the enclosure for producing a monitoring signal indicative of the sensor response to electrostatic field; and remote circuitry disposed external to the enclosure and communicating with the electronic circuitry for producing an output signal representative of the monitoring signal from the electronic circuitry.

2. Apparatus as in claim 1 including a pair of the conductive layers disposed within the enclosure on opposite sides of a semiconductor wafer supported therein;

a pair of said sensors, each mounted on one of the conductive layers on facing sides thereof;

electronic circuitry for each of the sensors mounted within the enclosure and communicating with a respective one of the pair of sensors, each for producing the monitoring signal indicative of the respective sensor response to electrostatic field; and the remote circuitry communicates with the electronic circuitry for the pair of sensors for producing output signals representative of the monitoring signals from the electronic circuitry for each of the pair of sensors.

3. Apparatus according to claim 1 in which the conductive layer is grounded; and the sensor responds to electrostatic field associated with charge on a semiconductor wafer transferred into or out of the enclosure.

4. Apparatus according to claim 1 in which the remote circuitry alters balance and gain of the monitoring signal to produce the output signal therefrom.

5. Apparatus according to claim 3 in which the sensor is mounted near a forward edge of the conductive layer in position to sense electrostatic field along a segment of a semiconductor wafer transferred into or out of the enclosure.

6. Apparatus according to claim 1 in which the remote circuitry alters balance level of the monitoring signal relative to ground potential, and alters gain of the output signal relative to the monitoring signal.

7. A method for calibrating field-sensing apparatus including a field sensor and monitoring circuitry disposed to sense electrostatic field associated with charge on a semiconductor wafer that is supportable within an enclosure, the method comprising:

processing a signal produced in response to the sensor sensing electrostatic field associated with charge to produce an output;

altering the processing of the signal to produce zero output in response to the sensor sensing ground reference potential; and altering the processing of the signal to produce an output directly proportional to the sensor sensing electrostatic field associated with a known potential.

8. The method of claim 7 including a field sensor on each side of a semiconductor wafer that is supportable within an enclosure, the method comprising:

processing signals produced in response to each sensor sensing electrostatic field to produce outputs therefrom;

altering the processing of each signal to produce zero outputs in response to the sensors sensing ground reference potential; and altering the processing of each signal to produce outputs directly related to the sensors sensing electrostatic fields associated with known potentials.

9. The method according to claim 7 in which a grounded conductive plate is disposed at a location near the sensor at which a semiconductor wafer is to be located for altering the processing to produce zero output on ground reference potential.

10. The method according to claim 7 in which an insulated plate is charged to a known potential and is disposed at a location near the sensor at which a semiconductor wafer is to be located for altering the processing to produce the output related to the known potential.

11. The method according to claim 8 in which a grounded conductive plate is disposed at a location intermediate the sensors at which a semiconductor wafer is to be located for altering the processing to produce zero outputs on ground reference potential.

12. The method according to claim 8 in which an insulated plate is charged to a known potential and is disposed at a location intermediate the sensors at which a semiconductor wafer is to be located for altering the processing to produce the outputs related to the known potential.

13. A method of sensing electrostatic field on a substrate wafer including electrically insulating material upon transfer to or from a housing, the method comprising:

positioning an isopotential surface at least on one side adjacent a position in the housing for receiving a substrate wafer; and sensing field on an adjacent surface of a substrate wafer relative to the isopotential surface during transfer of the substrate wafer into or out of the housing.

14. The method according to claim 13 in which positioning includes positioning electrically conductive plates spaced apart an opposite sides of the position in the housing for receiving a substrate wafer; and sensing includes sensing electrostatic fields associated with charge along paths of relative movement between locations on the plates and a substrate wafer during transfer thereof into or out of the housing to produce electrical outputs indicative of the field sensed on opposite sides of the substrate wafer.

15. The method according to claim 13 in which the isopotential surface is grounded.

16. The method according to claim 14 in which field sensing is performed from said locations that are disposed near forward edges of the plates.

* * * * *